United States Patent
Asai et al.

(10) Patent No.: US 12,185,458 B2
(45) Date of Patent: Dec. 31, 2024

(54) FLEXIBLE WIRING BOARD

(71) Applicant: Murata Manufacturing Co., Ltd., Nagaokakyo (JP)

(72) Inventors: Ryo Asai, Nagaokakyo (JP); Hayato Katsu, Nagaokakyo (JP); Keisuke Nishida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 149 days.

(21) Appl. No.: 18/053,395

(22) Filed: Nov. 8, 2022

(65) Prior Publication Data

US 2023/0073700 A1    Mar. 9, 2023

Related U.S. Application Data

(63) Continuation of application No. PCT/JP2022/014508, filed on Mar. 25, 2022.

(30) Foreign Application Priority Data

Sep. 3, 2021    (JP) .................................. 2021-144330

(51) Int. Cl.
*H05K 1/03*    (2006.01)
*H05K 1/02*    (2006.01)
(Continued)

(52) U.S. Cl.
CPC ........... *H05K 1/0281* (2013.01); *H05K 1/036* (2013.01); *H05K 1/189* (2013.01); *H05K 1/0373* (2013.01); *H05K 1/095* (2013.01); *H05K 2201/0145* (2013.01); *H05K 2201/0154* (2013.01); *H05K 2201/0158* (2013.01);
(Continued)

(58) Field of Classification Search
CPC .... H05K 1/0393; H05K 1/0281; H05K 1/036; H05K 1/189
See application file for complete search history.

(56) References Cited

U.S. PATENT DOCUMENTS

| | | | |
|---|---|---|---|
| 2004/0020687 A1* | 2/2004 | Moore | H05K 1/0212 219/209 |
| 2018/0249576 A1 | 8/2018 | Ogura | |

(Continued)

FOREIGN PATENT DOCUMENTS

| | | |
|---|---|---|
| JP | 2016143557 A | 8/2016 |
| JP | 2019075491 A | 5/2019 |

(Continued)

OTHER PUBLICATIONS

International Search Report in PCT/JP2022/014508, mailed on May 31, 2022, 3 pages.

*Primary Examiner* — Jeremy C Norris
(74) *Attorney, Agent, or Firm* — ArentFox Schiff LLP

(57) ABSTRACT

A flexible wiring board that includes a flexible substrate; a flexible wiring over the flexible substrate; and a protective layer over the flexible substrate, where the protective layer includes: a first region that overlaps with the flexible wiring and a second region that does not overlap with the flexible wiring as viewed from a thickness direction of the flexible substrate, and a low flexibility part that is higher in flexibility ratio than the first region and is disposed along an extending direction of the flexible wiring in the second region.

18 Claims, 9 Drawing Sheets

(51) Int. Cl.
*H05K 1/18* (2006.01)
*H05K 1/09* (2006.01)

(52) U.S. Cl.
CPC ........... *H05K 2201/0162* (2013.01); *H05K 2201/0191* (2013.01); *H05K 2201/0314* (2013.01); *H05K 2201/09045* (2013.01); *H05K 2201/09227* (2013.01)

(56) References Cited

U.S. PATENT DOCUMENTS

2020/0267835 A1 8/2020 Okimoto et al.
2021/0176858 A1 6/2021 Okimoto et al.

FOREIGN PATENT DOCUMENTS

| JP | 2019176170 A | 10/2019 |
| JP | 2020136350 A | 8/2020 |
| JP | 2021057507 A | 4/2021 |

\* cited by examiner

FLEXIBLE WIRING BOARD

CROSS REFERENCE TO RELATED APPLICATIONS

The present application is a continuation of International application No. PCT/JP2022/014508, filed Mar. 25, 2022, which claims priority to Japanese Patent Application No. 2021-144330, filed Sep. 3, 2021, the entire contents of each of which are incorporated herein by reference.

FIELD OF THE INVENTION

The present invention relates to a flexible wiring board.

BACKGROUND OF THE INVENTION

In recent years, conditions and the like of human bodies have been managed by acquiring and then analyzing biological information. For gathering such information, flexible wiring boards for use with flexible substrates attached to living bodies are known. Flexible substrates are provided with flexible wirings, and the flexible wirings may undergo a change in resistance due to flexible deformation or the like. In contrast, for example, the flexible wiring board described in Patent Document 1 has a poorly flexible member provided so as to be overlapped with a flexible wiring for reducing the change in the resistance value of the flexible wiring due to flexible deformation.

Patent Document 1: Japanese Patent Application Laid-Open No. 2016-143557

SUMMARY OF THE INVENTION

In the flexible wiring board, a part that undergoes a change in flexibility is likely to become a starting point of breakage. More specifically, such a structure that has a flexible wiring covered with a poorly flexible wiring member as in Patent Document 1 has the possibility of producing a difference in flexibility between the central part and ends of the flexible wiring in the width direction of the flexible wiring, thereby causing breakages in the vicinity of the ends of the flexible wiring. The present invention has been made for solving the problem mentioned above, and an object of the invention is to provide a flexible wiring board, which is capable of reducing a difference in flexibility in the width direction of a flexible wiring, and reducing the possibility of breaking the flexible wiring.

The present invention relates to a flexible wiring board including a flexible substrate; a flexible wiring over the flexible substrate; and a protective layer over the flexible substrate, where the protective layer includes: a first region that overlaps with the flexible wiring and a second region that does not overlap with the flexible wiring as viewed from a thickness direction of the flexible substrate, and a low flexibility part that is higher in flexibility ratio than the first region and is disposed along an extending direction of the flexible wiring in the second region.

According to the present invention, a flexible wiring board can be provided, which has a reduced difference in flexibility in the width direction of the flexible wiring, and has the reduced possibility of disconnection of the flexible wiring.

DETAILED DESCRIPTION OF THE INVENTION

Hereinafter, multiple embodiments for carrying out the present invention will be described with reference to the drawings. The respective embodiments are considered by way of example, and it is possible to substitute or combine parts of configurations presented in different embodiments. In each embodiment, differences from the description before the embodiment will be mainly described. Particularly, the similar functions and effects achieved by similar configurations will not be mentioned sequentially for each embodiment. It is to be noted that in the description of the embodiments, the extending direction of a flexible wiring in the sectional view is regarded an X axis, the width direction of the wiring in the sectional view is regarded as a Y axis, and the thickness direction of a board is regarded as a Z axis.

First Embodiment

Figure 1:
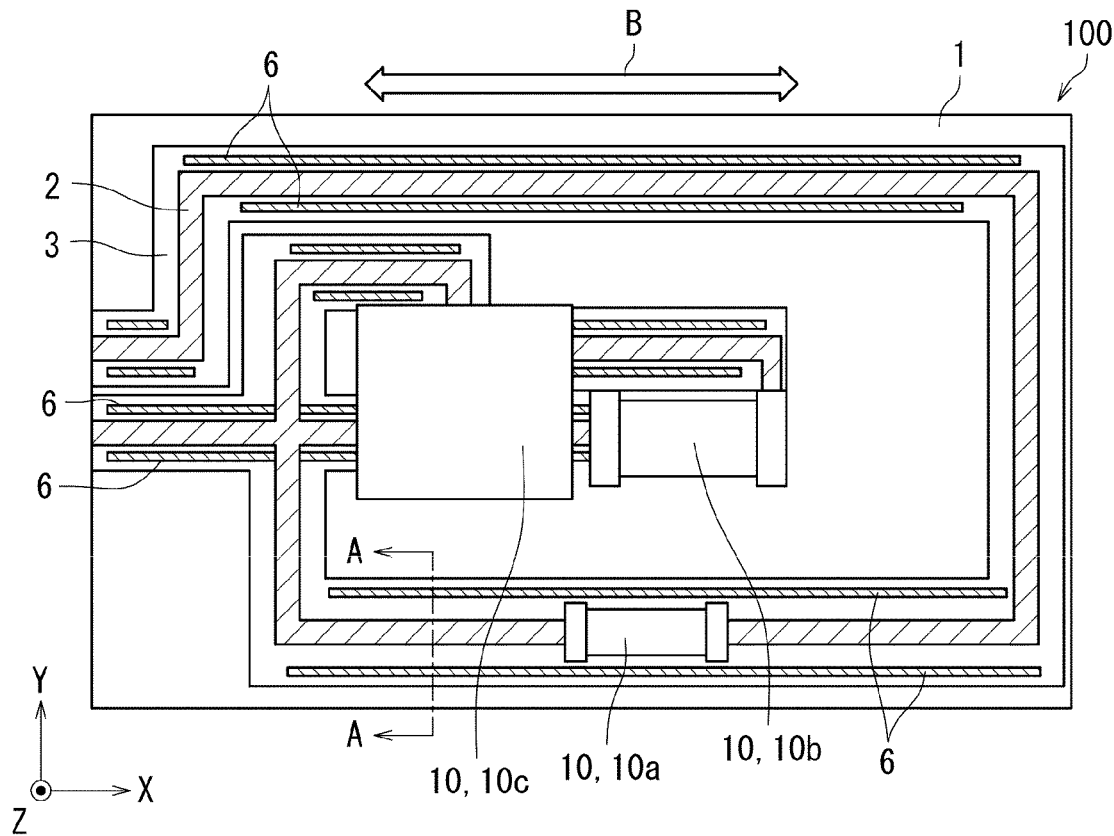
FIG. 1 is a top view of a flexible wiring board according to a first embodiment.
Figure 2:
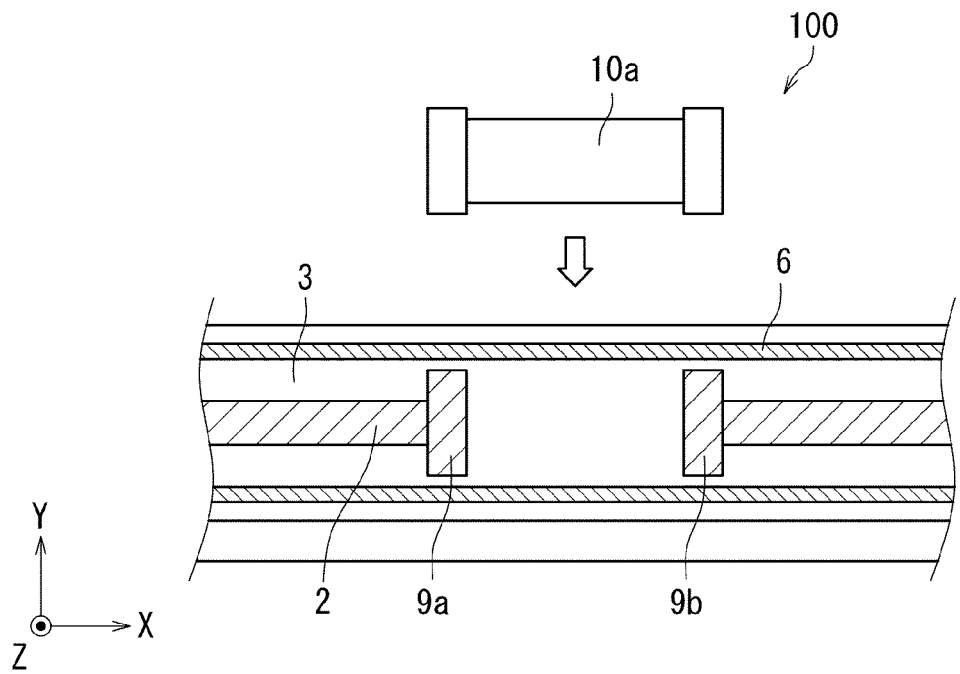
FIG. 2 is an exploded view of a part of the flexible wiring board according to the first embodiment.
Figure 3:
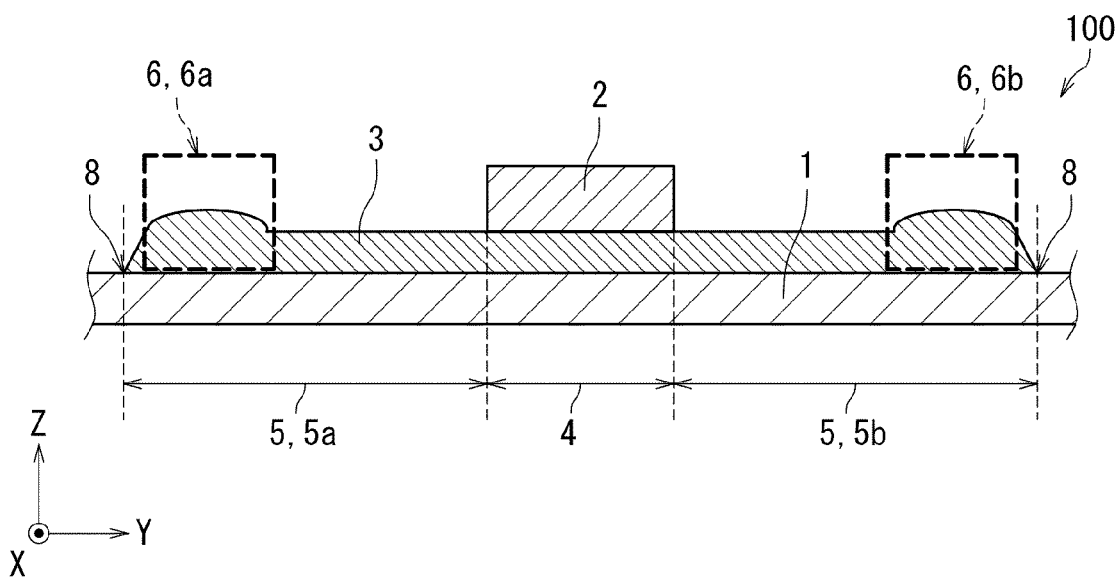
FIG. 3 is a sectional view of a part of the flexible wiring board according to the first embodiment.

FIG. 1 is a top view of a flexible wiring board 100 according to a first embodiment. FIG. 2 is an exploded view of a part of the flexible wiring board 100 according to the first embodiment. FIG. 3 is a sectional view of a part of the flexible wiring board 100 according to the first embodiment.

The flexible wiring board 100 illustrated in FIGS. 1 to 3 includes a flexible substrate 1, a flexible wiring 2 provided on the flexible substrate 1, a protective layer 3 disposed so as to overlap with the flexible wiring 2, low flexibility parts 6 (6a, 6b) disposed on a part of the protective layer 3, and electronic components 10 (10a, 10b, 10c) mounted on the flexible substrate 1. Reference numeral 6 is regarded as a generic term for reference numerals 6a and 6b, and reference numeral 10 is regarded as a generic term for reference numerals 10a, 10b, and 10c. Further, although FIGS. 1 and 2 are not sectional views, the flexible wiring 2 and the low flexibility parts 6 are indicated by hatching therein for the sake of convenience, and the same applies to FIGS. 11 and 15.

In FIG. 1, the extending direction assumed in the use of the flexible wiring board 100 is indicated by a double-headed arrow B. This extending direction is the same direction as the extending direction of the flexible wiring 2. In the following description of the embodiments, the direction indicated by the double-headed arrow B is regarded as the X axis. It is to be noted that the arrows in the extending direction are not intended to mean that the flexible wiring board 100 extends only in the directions, and the flexible wiring board may extend in other directions.

The flexible substrate 1 is a sheet-shaped or film-shaped flexible substrate, which is made of, for example, a flexible resin material. Examples of the resin material include a thermoplastic polyurethane. The thickness of the flexible substrate 1 is not particularly limited, but is preferably 1 mm or less, more preferably 100 μm or less, still more preferably 1 μm or less from the viewpoint of keeping the flexibility of the surface of a living body from being blocked when the flexible substrate 1 is attached to the living body. In addition, the thickness of the flexible substrate 1 is preferably 0.1 μm or more.

The flexible wiring 2 is routed in a predetermined pattern on the main surface of the flexible substrate 1, and includes conductive particles and a resin. Examples thereof include a mixture of a metal powders such as Ag, Cu, and Ni as the conductive particles and an elastomer-based resin such as a silicone resin. The average particle size of the conductive particles is not to be considered particularly limited, but is preferably 0.01 μm to 10 μm. In addition, the conductive particles preferably have a spherical shape. The thickness of the flexible wiring 2 is not particularly limited, but is preferably 100 μm or less, more preferably 50 μm or less. In addition, the thickness of the flexible wiring 2 is preferably 0.01 μm or more. The line width (Y axis in FIG. 2) of the flexible wiring is not particularly limited, but is preferably 0.1 μm or more, and more preferably 10 mm or less.

The protective layer 3 protects the flexible wiring 2 from stress in the case of extending the flexible substrate 1. The protective layer 3 is disposed such that at least a part thereof is overlapped with the flexible wiring 2 as viewed from the Z-axis direction.

The protective layer 3 is preferably a resin material or a mixture of a resin material and an inorganic material, and examples of the resin material include elastomeric resins such as urethane-based, styrene-based, olefin-based, silicone-based, fluorine-based, nitrile rubber, latex rubber, vinyl chloride, ester-based, and amide-based resins, and epoxy, phenol, acrylic, polyester, imide-based, rosin, cellulose, polyethylene terephthalate-based, polyethylene naphthalate-based, and polycarbonate-based resins.

The protective layer 3 includes a first region 4 that overlaps with the flexible wiring 2 as viewed from the Z-axis direction, that is, as viewed from the thickness direction of the flexible substrate 1, and a second region 5 that does not overlap with the flexible wiring 2 as viewed from the Z-axis direction. Reference numeral 5 is regarded as a general term for reference numerals 5a and 5b. According to the present embodiment, the protective layer 3 is provided along the flexible wiring 2 to be slightly larger than the flexible wiring 2 in substantially the same pattern as the flexible wiring 2. The protective layer 3 is provided in substantially the same pattern as the flexible wiring 2, thereby allowing the flexible wiring 2 to be protected from stress associated with the extension of the flexible substrate 1 without significantly blocking the flexibility of the whole flexible substrate 1.

The low flexibility part 6 is provided along the flexible wiring 2 in the second region 5 of the protective layer 3, and is a part that is higher in flexibility ratio than the first region 4 in the protective layer 3. It is to be noted that the "flexibility ratio" in this specification is defined by the product of the length of the protective layer 3 in the Z-axis direction (that is, the thickness of the protective layer 3) and the Young's modulus of the member constituting the protective layer 3. If such a structure has multiple members overlapped with each other in the Z-axis direction, the flexibility ratio has a value obtained by summing the products of the Young's modulus and thickness for each of the members. More specifically, the protective layer 3 is less flexible with the increased flexibility ratio thereof. The low flexibility part 6 is disposed along the flexible wiring 2 in the second region 5, thereby reducing the flexibility of the second region 5. More specifically, the difference in flexibility in the width direction of the flexible wiring 2 is reduced, thus suppressing the generation of a site that serves as a starting point of disconnection.

Examples of the method for providing the low flexibility part 6 at a specific site of the protective layer 3 include increasing the thickness of the specific site, applying a heat treatment to the specific site, and using a member with a high Young's modulus for the specific site. These methods may be used alone, or may be used in combination. For the present embodiment, the method of increasing the thickness of the specific site is used, and examples of the method include printing for only the site more than once and increasing the pattern aperture ratio of a screen plate for use in screen printing for only the site.

It is to be noted that the fact that "the low flexibility part 6 is higher in flexibility ratio than the first region 4" means that the low flexibility part 6 is higher in flexibility ratio than any part of the first region 4 as viewed in an arbitrary sectional view including the low flexibility part 6. The flexibility ratio of the first region 4 refers to, more specifically, the flexibility ratio of the part excluding the flexible substrate 1 and the flexible wiring 2 in the sectional view, that is, the flexibility ratio of the first region 4 in the protective layer 3. In addition, the flexibility ratio of the low flexibility part 6 is preferably higher than the sum of the flexibility ratio of the first region 4 and the flexibility ratio of the flexible wiring 2. Such a structure allows the difference in flexibility to be more reliably reduced.

The flexible wiring board 100 is not limited to the structure illustrated in FIG. 1. The low flexibility parts 6 are provided respectively on both sides of the flexible wiring 2 extending in the X-axis direction as the extending direction in FIG. 1, but the low flexible parts 6 may be similarly provided for the flexible wiring 2 extending in the Y-axis direction. More specifically, the low flexibility part is preferably provided along the flexible wiring in the main extending direction of the flexible substrate. The wiring extending in the X-axis direction may have, however, a wiring provided no low flexibility part. In particular, the wiring connecting the electronic component 10b and the electronic component 10c disposed adjacent to each other in the extending direction (X-axis direction) is preferably provided with the low flexibility part 6.

The electronic components 10 are connected to the flexible wiring 2. The electronic components 10 may have external terminals directly connected to the flexible wiring 2, or connected with, for example, a solder or a conductive adhesive interposed therebetween. The electronic components 10 are roughly divided into active components and passive components. Examples of the active components include amplifiers (such as operational amplifier and transistors) and diodes. Examples of the passive components include capacitors, resistors, and inductors. The shapes of the electronic components 10 are not limited to the shape illustrated in FIG. 1, and may be any shape.

FIG. 2 is an exploded view illustrating the protective layer 3 for a component mounting site. The two external terminals provided at both ends of the electronic component 10a are connected respectively to component connections 9a and 9b connected to the flexible wiring 2. The component connections 9a and 9b are preferably formed integrally with the flexible wiring 2. The component connections 9a and 9b are preferably protected by the protective layer 3, because the component connections 9a and 9b may be possibly broken due to the flexible wiring board 100 extended. In FIG. 2, the protective layer 3 and the low flexibility parts 6 are disposed so as to follow the component connections 9a and 9b. In addition, the part without the flexible wiring 2 and the component connections 9a and 9b, that is, the part between the component connection 9a and the component connection 9b may be provided with the protective layer 3 as illustrated in FIG. 2, or may be provided without any protective layer 3. The same applies to the low flexibility parts 6.

FIG. 3 is a sectional view taken along the line A-A in FIG. 1. Hereinafter, the sectional view will be described with different reference numerals for the sake of convenience in the case of multiple first regions 4, multiple second regions 5, and multiple low flexibility parts 6 provided.

According to the first embodiment, the protective layer 3 is provided in the flexible substrate 1, and the flexible wiring 2 is provided thereon. More specifically, the first region 4 is disposed between the flexible wiring 2 and the flexible substrate 1 in the thickness direction of the flexible substrate 1. In addition, according to the first embodiment, the protective layer 3 includes second regions 5a and 5b on both sides of the first region 4, that is, on both sides of the flexible wiring 2 in the width direction of the flexible wiring 2, and the second regions 5a and 5b respectively include low flexibility parts 6a and 6b. It is to be noted that the low flexibility parts 6a and 6b are shown as parts surrounded by dotted frames in the drawing.

According to the first embodiment, the protective layers 3 are all made of the same member. More specifically, the magnitude relationship of the length in the thickness direction of the protective layer 3 is equal to the magnitude relationship of the flexibility ratio. Thus, a part that has a larger thickness than the first region serves as the low flexibility part 6.

As described above, the low flexibility parts 6a and 6b are less likely to stretch than the other parts of the protective layer 3. The low flexibility part is thus provided, thereby allowing the reduced difference in flexibility in the width direction of the flexible wiring and the reduced possibility of disconnection of the flexible wiring itself.

According to the first embodiment, as shown in FIG. 3, the protective layer ends 8 may be excluded in the low flexibility parts 6. In order to reduce the difference in flexibility in the width direction of the flexible wiring, which is an object of the present invention, the flexibility of the first region may be made more uniform. More specifically, a protective layer that is low in flexibility may be provided outside the low flexibility part 6a (6b).

It is to be noted that the Y-axis direction distance between the flexible wiring and the low flexibility part is preferably 700 μm or less, more preferably 500 μm or less.

As illustrated in FIG. 3, the second region 5a and the second region 5b, as well as the low flexibility part 6a and the low flexibility part 6b, are arranged symmetrically with respect to the first region 4 in the sectional view, thereby making the flexibility of the flexible wiring 2 to be made uniform.

In addition, as shown in FIG. 3, a part of the low flexibility parts 6a and 6b with the smallest thickness is larger in thickness than a part of the first region 4 with the largest thickness. The thickness of the protective layer is changed as described above to increase the influence of the low flexibility parts 6a and 6b on the flexible wiring board 100, thus allowing the flexibility of the flexible wiring 2 to be made more uniform.

Modification Example 1 of First Embodiment

Figure 4:
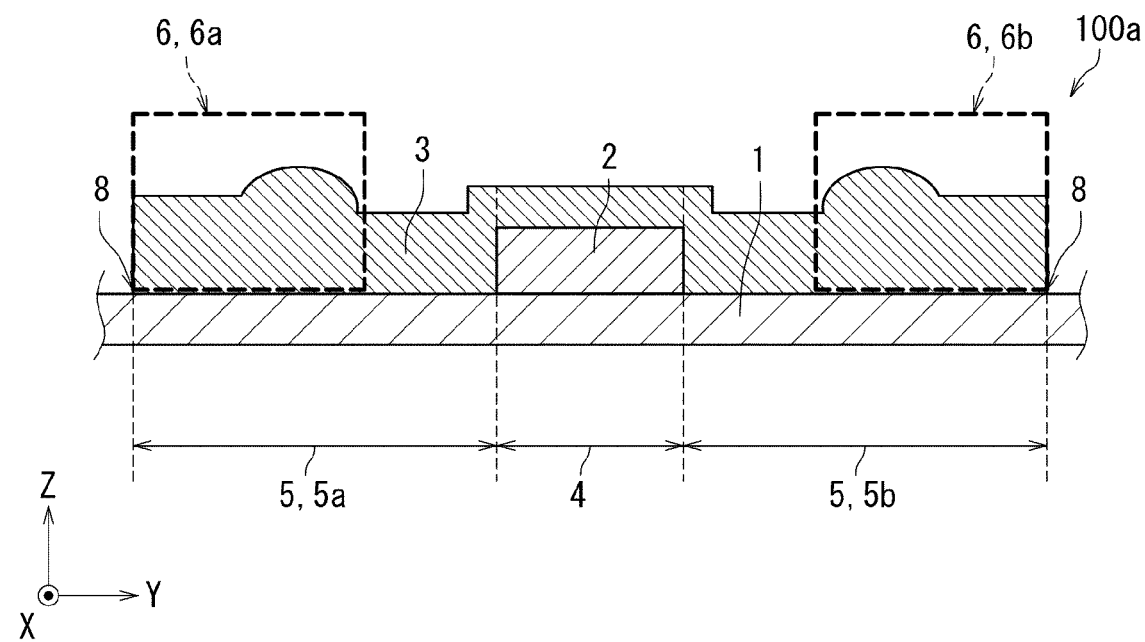
FIG. 4 is a sectional view of a part of a flexible wiring board according to Modification Example 1 of the first embodiment.

FIG. 4 is a sectional view of a part of a flexible wiring board 100a according to Modification Example 1 of the first embodiment. Modification Example 1 differs from the first embodiment in the shape and disposed location of the protective layer 3.

As illustrated in FIG. 4, the flexible substrate 1 and the flexible wiring 2 may be brought into contact with each other, and the protective layer 3 may be disposed so as to cover the flexible wiring 2. The protective layer 3 is provided as described above, thereby allowing the upper surface of the flexible wiring 2 to be prevented from being exposed. As will be described later, the surface of the flexible wiring 2 may include irregularities. With the exposed upper surface of the flexible wiring 2, including irregularities, for example, in the case of providing a film-shaped member such as a laminate so as to cover the flexible wiring, there is a possibility that a void is produced between the irregularities at the surface and the member. The irregularities at the wiring surface can be reduced by selecting a flowable member and forming the protective layer 3 in accordance with a printing process.

In addition, the protective layer ends 8 are also different. The protective layer ends 8 are ends of the protective layer 3 in the Y axis direction. The protective layer ends 8 are not included in the low flexibility parts 6 in FIG. 3, but may be included in the low flexibility parts 6 as in FIG. 4. The protective layer ends 8 are included in the low flexibility part 6, thereby allowing the flexibility ratio of the whole protective layer to be made more uniform.

While the low flexibility parts 6 are intended to reduce the produced difference in flexibility in the first region 4 due to the flexibility of the flexible substrate 1, the possibility of disconnection of the flexible wiring 2 can be further reduced by reducing the difference in the flexibility of the whole protective layer 3.

Modified Example 2 of First Embodiment

Figure 5:
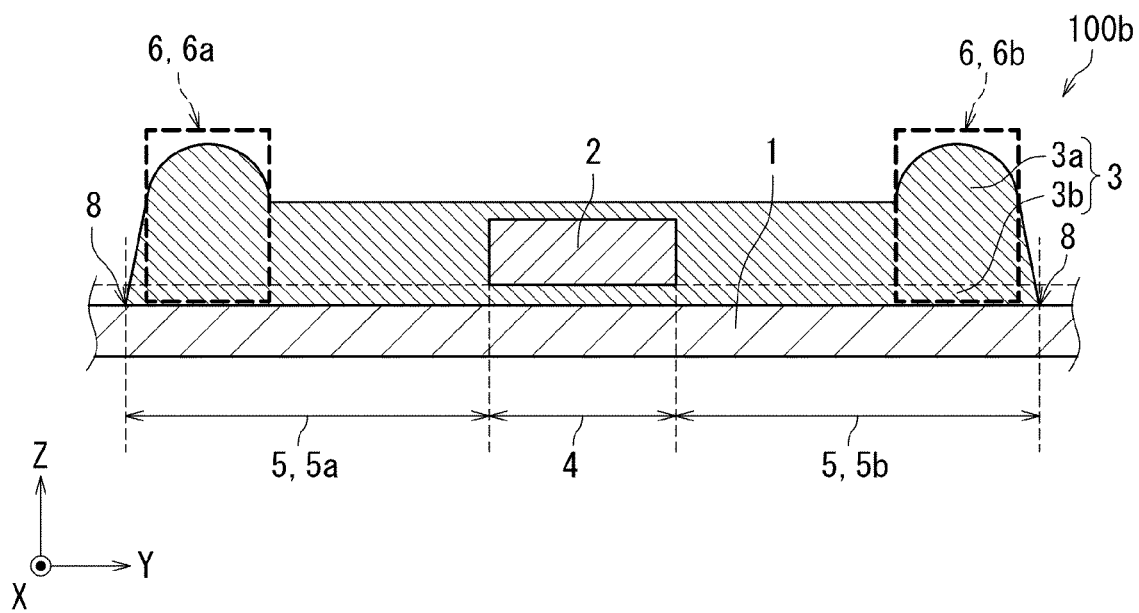
FIG. 5 is a sectional view of a part of a flexible wiring board according to Modification Example 2 of the first embodiment.

FIG. 5 is a sectional view of a part of a flexible wiring board 100b according to Modification Example 2 of the first embodiment. Modification Example 2 differs from the first embodiment in the number of layers of the protective layer 3. As illustrated in FIG. 3, in section view, the first region 4 and second regions 5a and 5b of the protective layer 3 may cover the whole periphery of the flexible wiring 2. Hereinafter, in the case of the protective layer 3 covering the periphery of the flexible wiring 2, a part of the protective layer 3 closer to the flexible substrate 1 than the flexible wiring 2 in the thickness direction is referred to as a lower layer first member 3b, and the other part thereof is referred to as an upper layer first member 3a. This structure can be formed by printing the lower layer first member 3b on the main surface of the flexible substrate 1, printing the flexible wiring 2 thereon, and further printing the upper layer first member 3a thereon.

As illustrated in FIG. 5, in the sectional view, the periphery of the flexible wiring 2 is covered with the upper layer first member 3a and lower layer first member 3b constituting the protective layer 3. Such a structure makes the whole flexible wiring more likely to be affected by the flexibility ratio of the protective layer, thus allowing the change in flexibility in the thickness direction of the wiring to be reduced.

First Example

Figure 6:
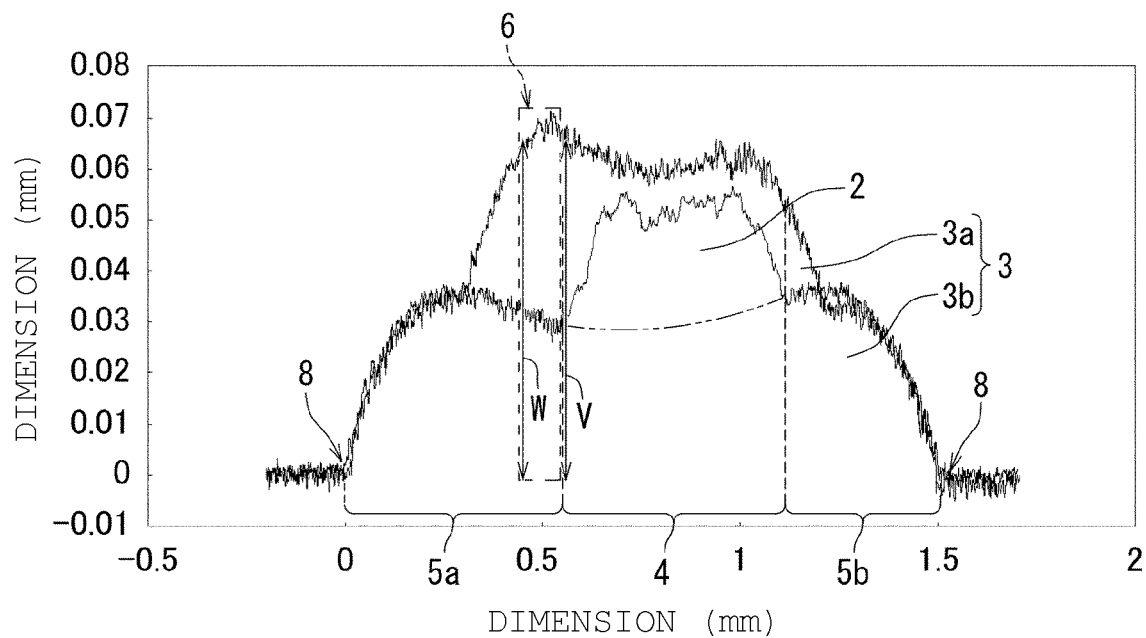
FIG. 6 is a diagram of coordinates plotted for a sectional view of a part of a flexible wiring board according to a first example.

FIG. 6 is a diagram of coordinates plotted for a sectional view of a part of a flexible wiring board according to a first example. For the flexible wiring board according to the first example, each coordinate was measured for an arbitrary sectional view including a protective layer with the use of Quick Vision from Mitutoyo Corporation. The results were plotted with the origin of the horizontal axis as the protective layer one-side end in the width direction of the wiring and the origin of the vertical axis as the surface of the flexible substrate. More specifically, the horizontal axis refers to the width direction of the flexible wiring, and the vertical axis refers to the thickness direction of the flexible wiring board. Specifically, as with Modification Example 2 of the first embodiment, the protective layer 3 includes the upper layer first member 3a and the lower layer first member 3b. It is to be noted that the illustration of the flexible substrate 1 is omitted in FIG. 6. In addition, the interface between the flexible wiring 2 and the lower layer first member 3b of the protective layer 3 is indicated by a two-dot chain line.

As illustrated in FIG. 6, there is no need for the low flexibility parts 6 to be provided in all over the second regions 5a and 5b. According to the first example, the low flexibility part 6 is provided only in the second region 5a of the second regions 5a and 5b. Similarly, there is no need for the protective layer 3 to be provided to be symmetric with respect to the flexible wiring.

As illustrated in FIG. 6, the surface of the flexible wiring 2 has irregularities, and when another member such as a laminate layer is stacked on the flexible wiring 2, there is a possibility that a void may be produced at the interface therebetween. The flexible wiring has, as described above, the possibility of causing ion migration because of the use of silver or the like. When there is any void in the vicinity of the flexible wiring, moisture will enter from the void, which has the possibility of causing an unexpected defect. The protective layer 3 covers the whole flexible wiring, thereby allowing the generation of voids at the interfaces between the wiring and the other members to be suppressed.

It is to be noted that in the present example, a member with a Young's modulus of 18.1 (MPa), a member with a Young's modulus of 102.1 (MPa), and a member with a Young's modulus of 651.9 (MPa) are used respectively for the flexible substrate 1, the flexible wiring 2, and the protective layers 3a and 3b.

The flexibility ratio of the present example is calculated with the use of values mentioned above. In the present example, a part with the largest flexibility ratio in the first region 4 has a flexibility ratio of about 41.92 (MPa·mm) around an arrow V in FIG. 6, and a part with the smallest flexibility ratio in the low flexibility part 6 has a flexibility ratio of 43.02 (MPa·mm) around an arrow W in FIG. 6. More specifically, the low flexibility part 6 all has a higher flexibility ratio than the first region 4. It is to be noted that although the part of the low flexibility part with the smallest flexibility ratio is actually the boundary of the low flexibility part in the present example, the arrow is slightly shifted for the sake of clarity in FIG. 6.

In the present example, the thickness of the low flexibility part 6 is the largest thickness among the part thicknesses obtained by summing the thicknesses of the protective layer 3 and flexible wiring 2 in the first region 4. Such a structure as in the present example is employed, thereby allowing the difference in the flexibility of flexible wiring to be more reliably reduced.

Second Embodiment

For a flexible wiring board 101 according to a second embodiment, a protective layer 3 includes multiple members. The flexible wiring board 101 according to the second embodiment is the same as the flexible wiring board according to the first embodiment except for the configuration and shape of the protective layer 3.

In the following description, the multiple members will be described respectively as a first member and a second member. In addition, the definitions of an upper layer and a lower layer in the second member are the same as those in a first member according to a third embodiment.

As the second member, a film-shaped member such as a packing film or a polyurethane film, an adhesive, or the like is preferred. In addition, among the examples of the first member described above, the different member from the member used for the first member may be used. According to the present embodiment, a member that is higher in Young's modulus than the first member is used as the second member.

Figure 7:
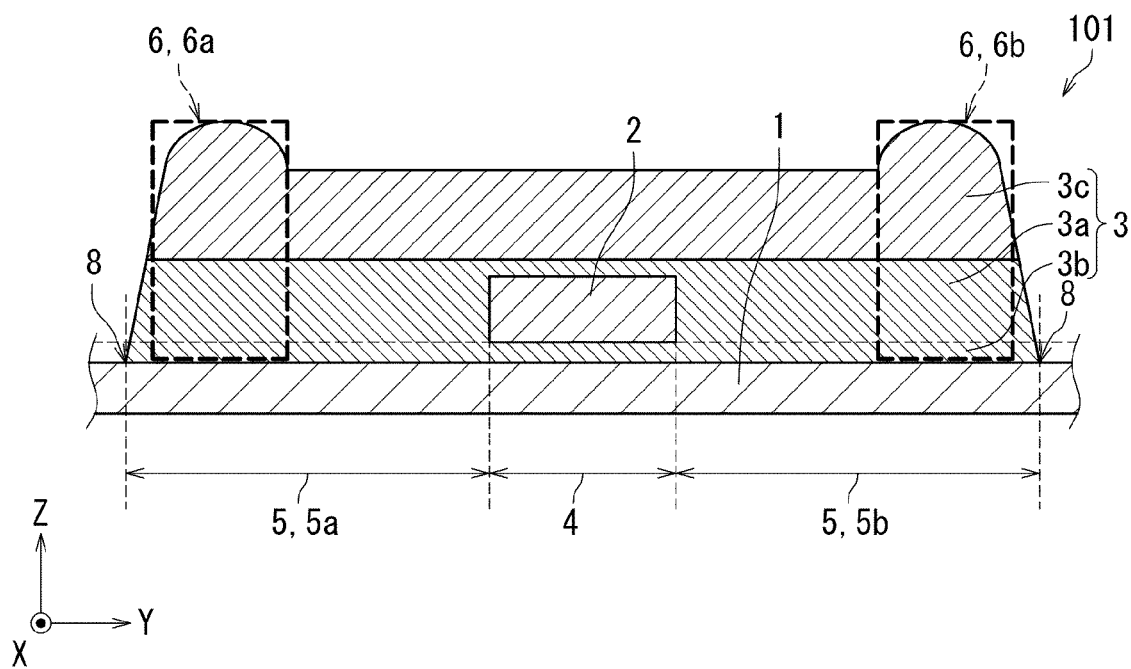
FIG. 7 is a sectional view of a part of a flexible wiring board according to a second embodiment.

FIG. 7 is a sectional view of a part of the flexible wiring board according to the second embodiment. As illustrated in FIG. 7, the protective layer 3 includes an upper layer first member 3a, a lower layer first member 3b, and an upper layer second member 3c.

As described above, the flexibility ratio is the product of the Young's modulus and the thickness, and thus, when the protective layer includes only one member as in the first embodiment, it is necessary to change the thickness in order to provide the low flexibility part. In contrast, when the protective layer includes multiple members, the flexibility ratio is obtained by summing the product of the Young's modulus and thickness for each member, and thus, if the low flexibility part is provided for at least one member, the low flexibility part will be provided for the whole protective layer. More specifically, when the protective layer includes multiple members, the low flexibility part can be provided by adding the thickness of one member if the thickness of another member is uniform.

In the flexible wiring board 101 shown in FIG. 7, the protective layer 3 includes the first member and second member laminated. The thickness of a part of the upper layer second member 3c is changed, thereby allowing the second member to be provided with a low flexibility part. In this case, as in FIG. 7, the first member including the flexible wiring 2 may be uniform in thickness. In addition, as in FIG. 7, the flexible wiring 2 may be all covered with the first member, all covered with the second member, or covered with the first member and the second member. For example, the first member may cover the lower half of the flexible wiring 2, and the second member may cover the upper half thereof.

Modification Example 1 of Second Embodiment

Figure 8:
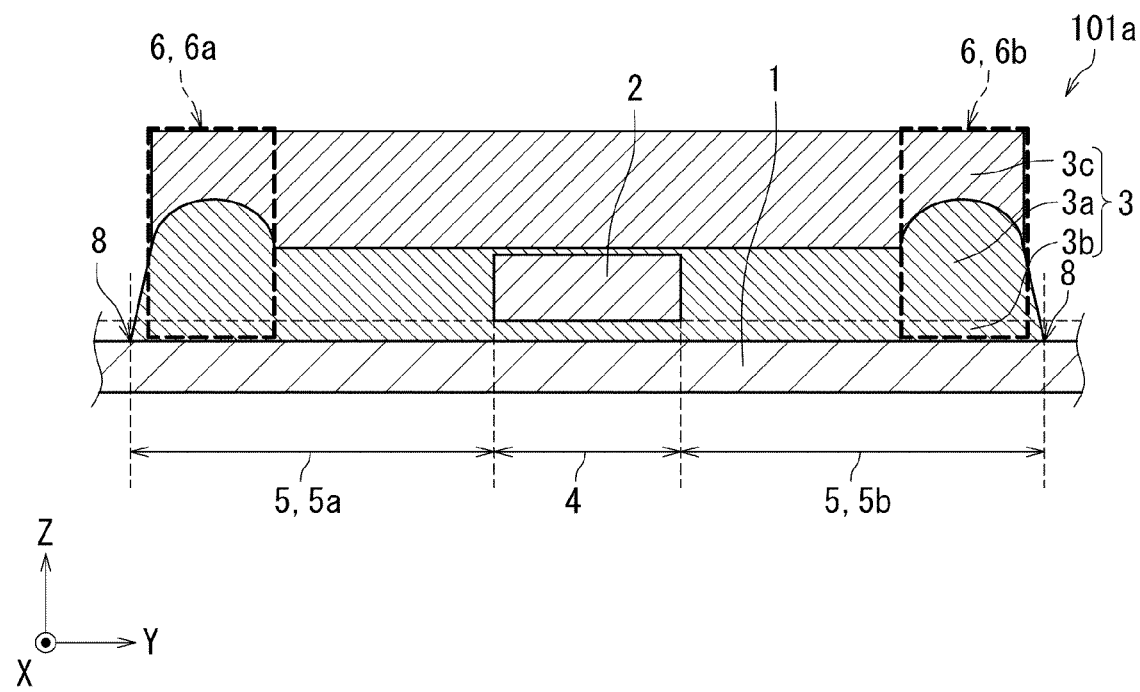
FIG. 8 is a sectional view of a part of a flexible wiring board according to Modification Example 1 of the second embodiment.

FIG. 8 is a sectional view of a part of a flexible wiring board 101a according to Modification Example 1 of the second embodiment. The present modification example differs from the second embodiment in the configuration of the protective layer 3. As in the second embodiment, the protective layer 3 includes an upper layer first member 3a, a lower layer first member 3b, and an upper layer second member 3c. More specifically, as illustrated in FIG. 8, the thicknesses in the vicinity of the ends of the first members 3a and 3b with a Young's modulus higher than that of the second member 3c may be increased, thereby constituting low flexibility parts 6a and 6b.

In FIG. 8, the first member and the second member are provided respectively with low flexibility parts that differ in thicknesses, and the respective low flexibility parts are combined so as not to be overlapped with each other. When the Young's modulus of the first member is higher than the Young's modulus of the second member, the low flexibility parts 6a and 6b are formed.

Such a combination as in FIG. 8 allows the thickness of the whole protective layer to be made uniform. As illustrated in FIG. 1, the flexible wiring board has various electronic components mounted, and thus, the mounting stability of the electronic components over the whole board can be improved by making the thickness of the protective layer uniform.

The present modification example is not limited to such an example as in FIG. 8, and the Young's modulus of the first member may be lower than the Young's modulus of the second member. In such a case, a part of the second member with a large thickness serves as a low flexibility part. In addition, the thickness of the whole protective layer may be ununiform. For example, obviously, the low flexibility parts provided respectively for the first member and the second member may be disposed to be overlapped with each other. As described above, the members that differ in Young's modus are combined, thereby allowing the protective layer to be provided with an arbitrary thickness.

Modification Example 2 of Second Embodiment

Figure 9:
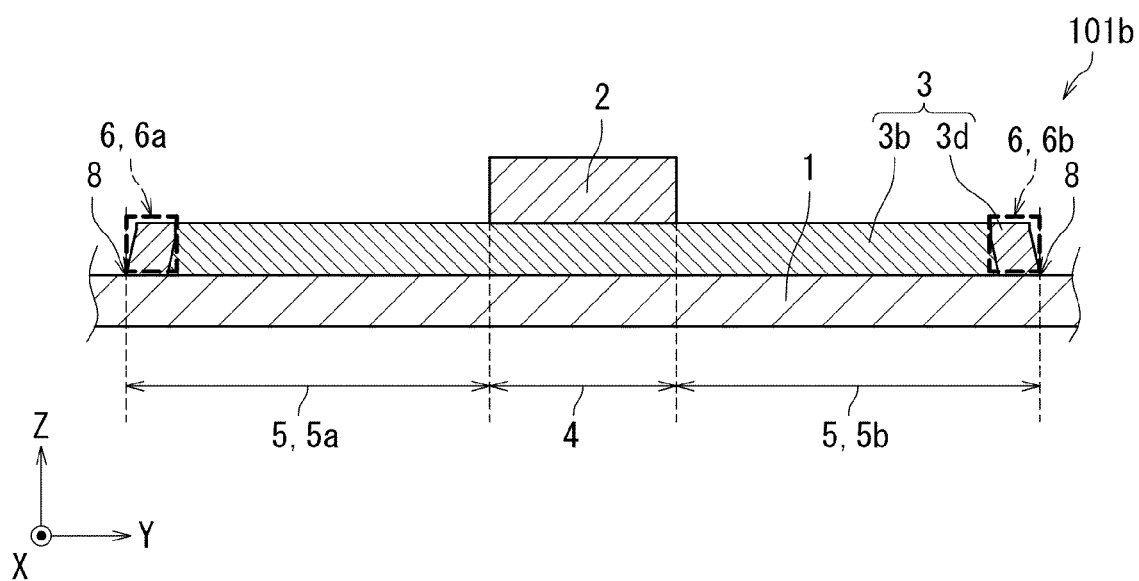
FIG. 9 is a sectional view of a part of a flexible wiring board according to Modification Example 2 of the second embodiment.

FIG. 9 is a sectional view of a part of a flexible wiring board 101b according to Modification Example 2 of the second embodiment. The present modification example differs from the second embodiment in the configuration of the protective layer 3.

As illustrated in FIG. 9, second members 3d may be provided only in second regions 5a and 5b. In FIG. 9, the lower layer first member 3b and lower layer second member 3d constituting the protective layer are disposed adjacent to each other on a flexible substrate 1, with each member in contact with the flexible substrate 1. In addition, the lower layer first member 3b and the lower layer second member 3d are provided to be connected in the width direction of the flexible wiring 2. According to Modification Example 2 illustrated in FIG. 9, the thickness of the whole protective layer is uniform, and the Young's modulus of the second member is higher than the Young's modulus of the first member. Thus, second members 6a and 6b themselves serve as low flexibility parts.

It is to be noted that although the members that are high in Young's modulus are combined to make the thickness of the whole protective layer uniform at the same time as providing the low flexibility parts in FIG. 9, the thickness of the whole protective layer may be ununiform. For example, the thickness of the second member may be larger than the thickness of the first member. In addition, as long as the Young's modulus of the second member is sufficiently high as compared with the Young's modulus of the first member, the second member may be smaller in thickness than the first member. In addition, as in the second embodiment, the first member and the second member may have parts that are not uniform in thickness.

Modification Example 3 of Second Embodiment

Figure 10:
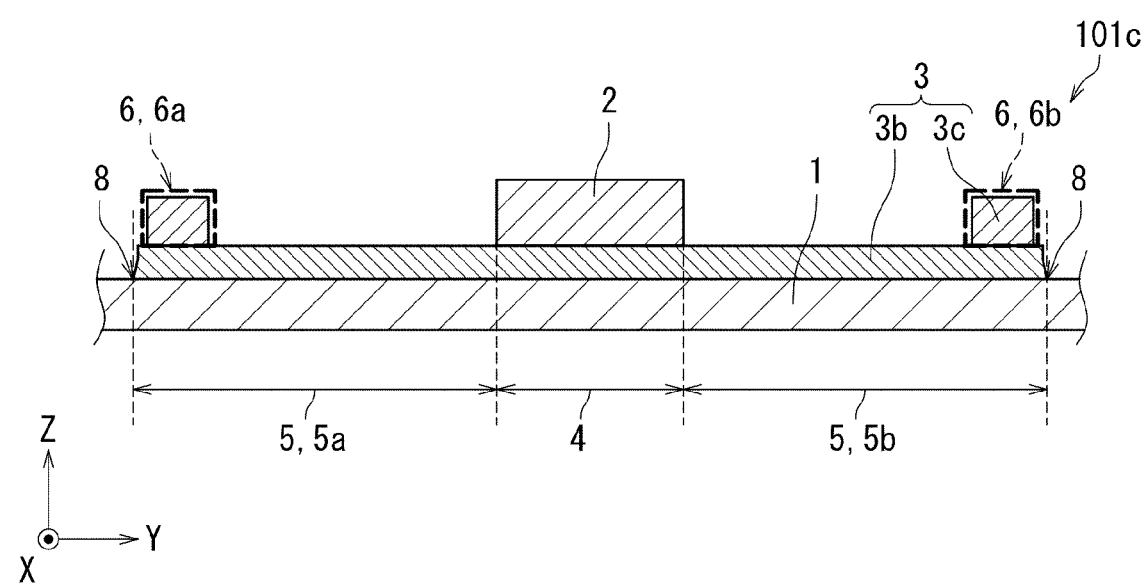
FIG. 10 is a sectional view of a part of a flexible wiring board according to Modification Example 3 of the second embodiment.

FIG. 10 is a sectional view of a part of a flexible wiring board 101c according to Modification Example 3 of the second embodiment. Modification Example 3 differs from the second embodiment in the configuration of the protective layer.

As illustrated in FIG. 10, the protective layer 3 may include a lower layer first member 3b and upper layer second members 3c. In FIG. 10, the thickness of the lower layer first member 3b is uniform, and parts provided with the upper layer second members 3c serve as low flexibility parts. Such a structure allows the low flexibility parts to be provided without changing the thickness of each member. In addition, when the first member is uniform in Young's modulus and thickness, the region where the second member is provided serves as a low flexibility part regardless of the Young's modulus and thickness of the second member, and thus, a protective layer that has an arbitrary thickness and an arbitrary pattern shape can be configured with the use of an arbitrary member.

It is to be noted that the flexibility of an arbitrary part in the flexible wiring board is known to be greatly affected by a part with the highest flexibility ratio. More specifically, in the present invention, the protective layer 3 is preferably a part with the highest flexibility ratio in the flexible wiring board 100. In other words, the flexibility ratio of the protective layer 3 is preferably higher than the flexibility ratio of the flexible substrate 1, and further the flexibility ratio of the flexible wiring. Accordingly, the Young's modulus of the member constituting the protective layer 3 is increased, thereby allowing the flexibility ratio of the protective layer 3 to be made higher than the flexibility ratio of the flexible substrate 1 if the protective layer 3 is smaller in thickness than the flexible substrate 1, which can thus lead to the reduced height of the protective layer 3.

When the protective layer 3 includes multiple members as in the second embodiment, at least one member has only to be higher in Young's modulus than flexible substrate 1, but all of the members are preferably higher in Young's modulus than flexible substrate 1. Specifically, the Young's modulus of the protective layer 3 is preferably 300% or more of the Young's modulus of the flexible substrate 1. Furthermore, the member constituting the low flexibility part 6 preferably has the highest Young's modulus among the members constituting the protective layer 3. The thickness of the low flexibility part can be reduced as the Young's modulus is higher, and the height of the low flexibility part 6 can be thus reduced.

Although the second embodiment and the modification examples s thereof have been described above, a third member may constitute the protective layer in addition to the first and second members. In such a case, the first member or the second member may provide a low flexibility part, with the third member uniformly laminated thereon, or the third member may provide a low flexibility part. The same applies to fourth and fifth members, if any.

Third Embodiment

Figure 11:
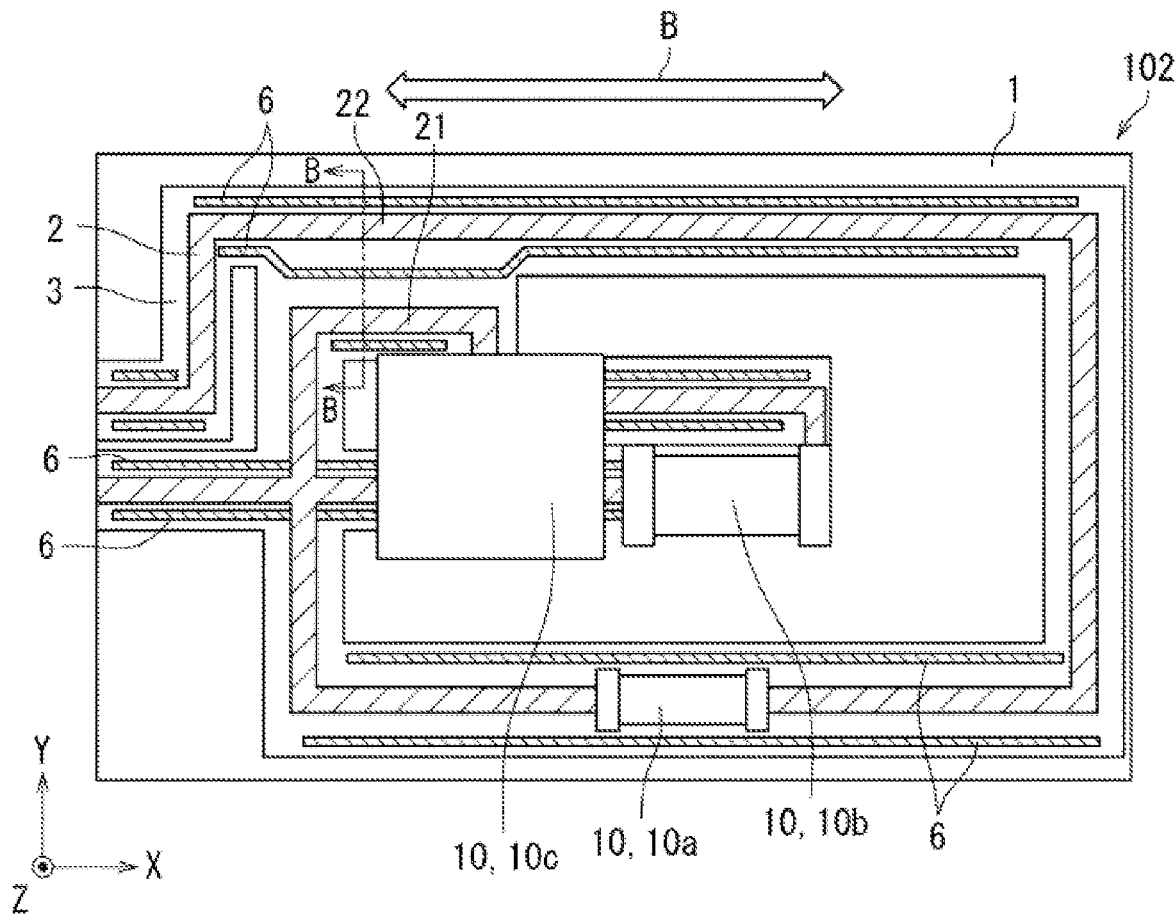
FIG. 11 is a top view of a flexible wiring board according to a third embodiment.
Figure 12:
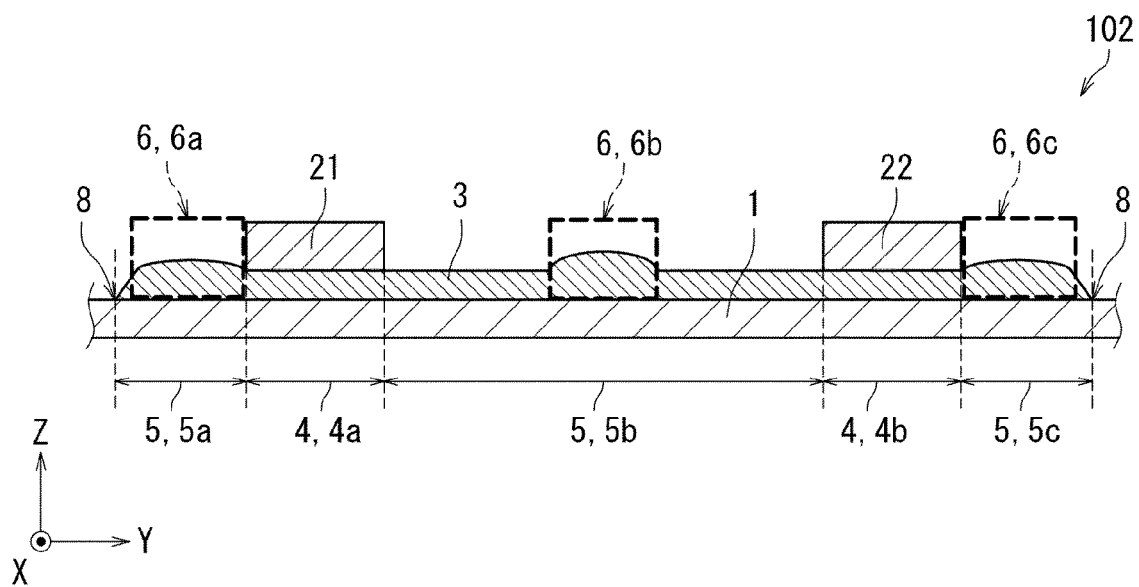
FIG. 12 is a sectional view of a part of the flexible wiring board according to the third embodiment.

FIG. 11 is a top view of a flexible wiring board 102 according to a third embodiment. FIG. 12 is a sectional view of a part of the flexible wiring board 102 according to the third embodiment, and is a sectional view taken along the line B-B in FIG. 11.

According to the third embodiment, the same protective layer 3 overlaps with multiple flexible wirings 21 and 22. As illustrated in FIG. 11, the same protective layer may be provided for multiple flexible wirings. It is to be noted that the same protective layer in this specification refers to a protective layer formed in common for multiple wirings in a sectional view (Y axis in the drawing) of the flexible wiring in the width direction thereof. The same protective layer is not necessarily formed from a single member, and a connected body of multiple members may constitute the protective layer.

When the same protective layer is provided for multiple wirings, the protective layer includes multiple first regions and multiple second regions. For example, as illustrated in FIG. 12, the protective layer includes multiple first regions 4a and 4b and multiple second regions 5a, 5b, and 5c. According to the third embodiment, the protective layer 3 is formed from a single member, and a part with a large thickness serves as a low flexibility part.

When the number of wirings is one as in the first embodiment and the second embodiment, the edge of the protective layer is likely to be stretched as described above. In contrast, when multiple flexible wirings are laid out in parallel, a part that is more likely to be stretched and a part that is less likely to be stretched are produced depending on the distance between one flexible wiring and the other flexible wiring.

This will be specifically described with reference to FIG. 12. First, the flexible wiring board 102 as in FIG. 12 has a protective layer end 8, which is likely to be extended. In addition, in consideration of the flexibility ratio of the flexible wiring, the parts overlapped with the flexible wirings 21 and 22 are less likely to be stretched than the part of only the protective layer. In other words, the second regions 5a, 5b, and 5c are more likely to be stretched than the first regions 4a and 4b. As described above, such a difference in flexibility ratio may cause disconnection of the flexible wiring. More specifically, in the case of having the first and second flexible wirings adjacent to each other, a low flexibility part 6b is preferably also provided between the wirings, that is, at the center of the second region 5b in addition to low flexibility parts 6a and 6c.

It is to be noted that as the interval between the flexible wirings 21 and 22 in the Y-axis direction is more closed, the second region at the center is less likely to be stretched. Accordingly, as long as the interval between the flexible wirings 21 and 22 in the Y-axis direction is sufficiently closed, there is no need for the low flexibility part 6b to be provided. More specifically, when the shortest distance from the flexible wiring 21 to the flexible wiring 22 is larger than the shortest distance from the flexible wiring 21 to the protective layer end 8, that is, when the interval between the flexible wiring 21 and the flexible wiring 22 is larger than the interval between the flexible wiring 21 and the protective layer end 8 (end on the left side in the drawing) closer thereto in the width direction of each flexible wiring, the low flexibility part 6b is preferably provided in the region between the respective flexible wirings. In other words, when the length of the second region 5b is larger than the length of the second region 5a in the Y-axis direction, the low flexibility part 6b is preferably provided. It is to be noted that the same applies to the relationship between the second region 5b and the second region 5c. Thus, multiple low flexibility parts may be provided in the second region 5b depending on the length of the second region 5b. In addition, although the low flexibility parts are provided by varying the thickness in FIG. 12, low flexibility parts may be provided by members that differ in Young's modulus as in the previous embodiments.

Fourth Embodiment

Figure 13:
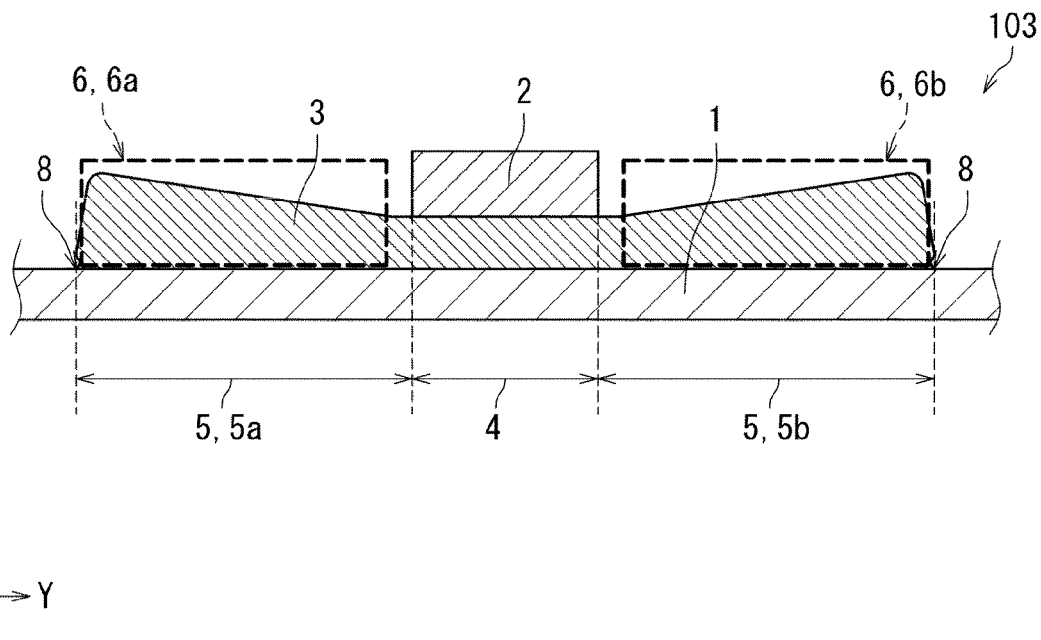
FIG. 13 is a sectional view of a part of the flexible wiring board according to a fourth embodiment.

FIG. 13 is a sectional view of a part of a flexible wiring board 103 according to a fourth embodiment. According to the third embodiment, low flexibility parts 6a and 6b are formed by gradually increasing the thickness from parts of the second regions 5a and 5b closest to the flexible wiring to parts thereof farthest therefrom in the width direction of the flexible wiring. More specifically, the second regions 5a and 5b are provided with a protective layer such that the flexibility ratio is gradually increased from the parts closest to the flexible wiring 2 to the ends. In addition, the low flexibility parts 6a and 6b in contact with the first region 4 in the width direction of the flexible wiring 2 are not limited to such a structure, and for example, a part that is uniform in thickness in line with the protective layer of the first region may be provided in a part of the second region. In such a case, the low flexibility part will not be brought into contact with the first region.

As illustrated in FIG. 13, the protective layer ends of the low flexibility parts 6a and 6b on the side opposite to the flexible wiring 2 may have parts that are low in flexibility ratio. In addition, parts that are high in flexibility ratio may serve as the ends of the protective layer.

As described above, when no low flexibility part is provided, the protective layer is gradually likely to be stretched from the central part to the ends. Thus, the flexibility ratios of the second regions 5a and 5b are gradually increased, thereby allowing for reducing a part where the flexibility ratio of the protective layer 3 significantly varies in the width direction of the flexible wiring 2.

In addition, the first region may also have a thickness gradually changed from the central part to the ends. The central part of the first region and the ends of the first region respectively correspond to the center and ends of the flexible wiring in the Y-axis direction. The first region and the second region, that is, the whole protective layer undergoes a gradual increase in flexibility ratio from the central part to the ends, thereby allowing the flexibility of the whole protective layer to be made more uniform.

Second Example

Figure 14:
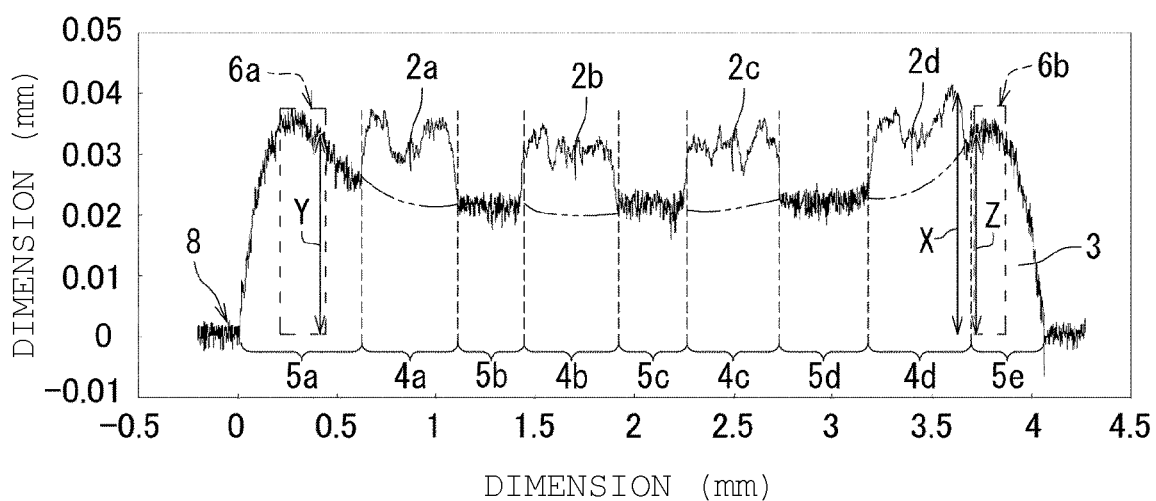
FIG. 14 is a diagram of coordinates plotted for a sectional view of a part of a flexible wiring board according to a second example.

FIG. 14 is a dimensional diagram of a flexible wiring board according to a second example. FIG. 14 is a diagram of coordinates plotted for a sectional view of a part of a flexible wiring board according to the second example. For the flexible wiring board according to the second example, each coordinate was measured for an arbitrary sectional view including a protective layer with the use of a non-contact displacement sensor (Quick Vision from Mitutoyo Corporation). The results were plotted with the origin of the horizontal axis as the protective layer one-side end in the width direction of the wiring and the origin of the vertical axis as the surface of the flexible substrate. More specifically, the horizontal axis refers to the width direction of the flexible wiring, and the vertical axis refers to the thickness direction of the flexible wiring board. The illustration of the flexible substrate 1 is omitted in FIG. 14. In addition, the interfaces between flexible wirings 2*a*, 2*b*, 2*c*, and 2*d* and a protective layer 3 are indicated by two-dot chain lines. According to the second example, the same protective layer is provided for the four flexible wirings. Thus, the board includes four first regions 4*a*, 4*b*, 4*c*, and 4*d* and five second regions 5*a*, 5*b*, 5*c*, 5*d*, and 5*e*. According to the present example, two low flexibility parts 6*a* and 6*b* are provided by changing the thickness of the protective layer 3.

It is to be noted that in the present example, a member with a Young's modulus of 18.1 (MPa), a member with a Young's modulus of 102.1 (MPa), and a member with a Young's modulus of 651.9 (MPa) are used respectively for the flexible substrate 1, the flexible wirings 2*a* to 2*d*, and the protective layer 3.

The flexibility ratio is calculated with the use of values mentioned above. In the present example, a part with the largest flexibility ratio, of the first regions 4*a*, 4*b*, 4*c*, and 4*d* has a flexibility ratio of about 20.58 (MPa·mm) around an arrow X in FIG. 14, and parts with the smallest flexibility ratio in the low flexibility parts 6*a* and 6*b* respectively have flexibility ratios of about 20.86 (MPa·mm) around arrows Y and Z in FIG. 14. More specifically, the low flexibility parts 6 all have higher flexibility ratios than all of the first regions 4.

In addition, as in the fourth embodiment, the protective layer 3 has a second region 5*c* that is a central part with an equal distance from both ends of the protective layer 3 in the width direction of each flexible wiring, and the thickness is gradually increased from the second region 5*c* to ends 8. As described above, when the same protective layer is provided for the multiple wirings, the central part of the protective layer may be located in the second region. In this case, each of the first regions has a thickness gradually changed from the one end toward the other end.

Depending on the number and arrangement of the flexible wirings, the board may include both a first region that has a thickness gradually changed from the center to both ends and a first region that has a thickness gradually changed from one end to the other end. For example, when such a protective layer as in Example 2 is provided for three flexible wirings arranged at equal intervals, a first region at the center has a thickness gradually changed from the center to both ends. The other first region has a thickness gradually changed from one end toward the other end. Such a structure allows the thickness of the protective layer to be gradually changed, thereby allowing for reducing points that undergo a significant change in flexibility.

The second example is not limited to the shape as in the drawing, and for example, as described in Modification Example 1 of the first embodiment, the ends of the protective layer may serve as low flexibility parts, or a protective layer that covers the surfaces of the flexible wirings may be further provided.

Fifth Embodiment

Figure 15:
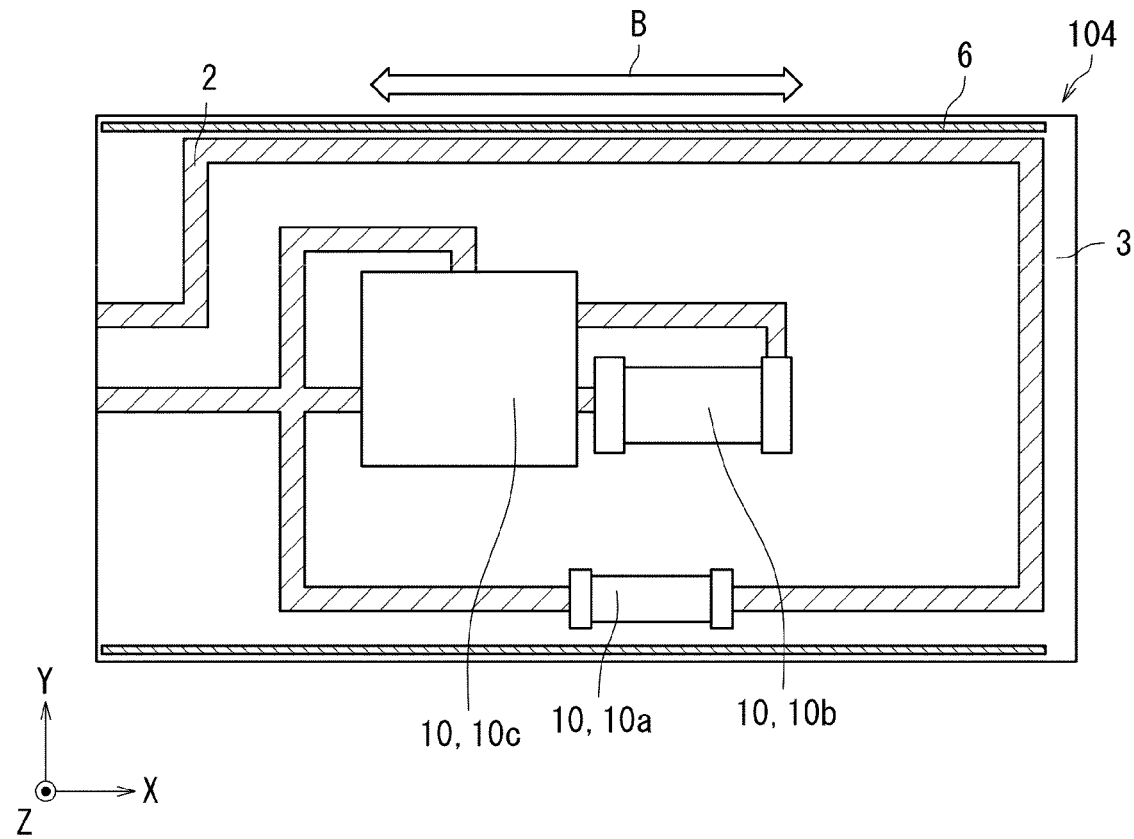
FIG. 15 is a top view of a flexible wiring board according to a fifth embodiment.

FIG. 15 is a top view of a flexible wiring board 104 according to a fifth embodiment. Although the protective layer is provided along the flexible wirings according to Embodiments 1 to 4, a protective layer may cover the whole of the flexible wiring board 104 as illustrated in FIG. 15. More specifically, the flexibility of the whole flexible wiring board can be adjusted by providing the protective layer so as to overlap the whole flexible substrate 1 as viewed from the thickness direction of the flexible substrate.

As illustrated in FIG. 15, when the protective layer 3 is overlapped over the whole of the flexible wiring board, there is no need for the low flexibility part to be provided for all the wiring. In FIG. 15, low flexibility parts are provided along both ends of the flexible wiring board 104 in the Y-axis direction thereof. In such a case, the same effect can be achieved as in the above-described embodiment in which the multiple flexible wirings are provided on the same protective layer.

It is to be noted that the protective layer may be disposed on the whole surface of the flexible substrate, and a low flexibility part may be provided so as to follow all the flexible wiring. In addition, as described in the second embodiment, a low flexibility part may be sectionally provided along a part where the flexible wiring is particularly likely to be stretched.

Sixth Embodiment

Figure 16:
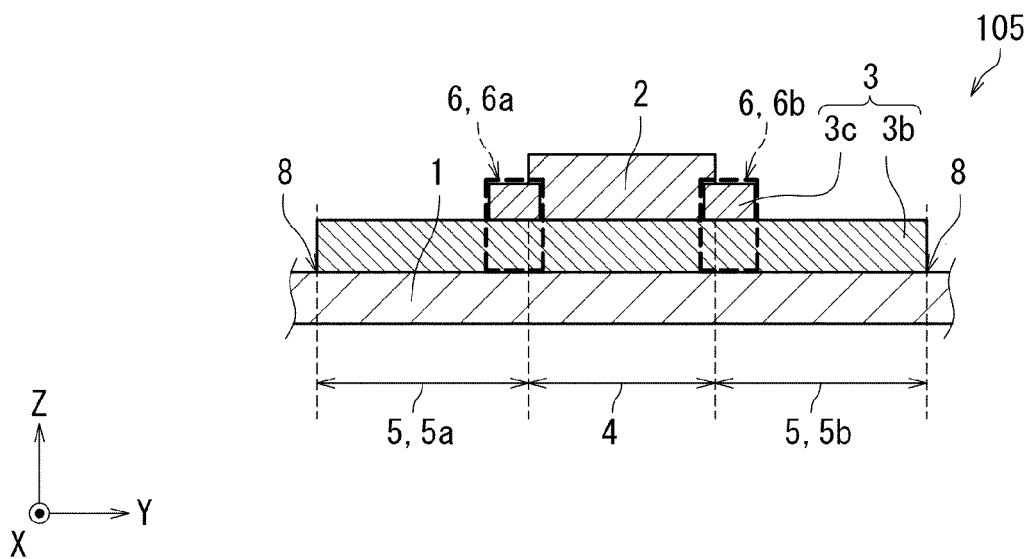
FIG. 16 is a sectional view of a part of a flexible wiring board according to a sixth embodiment.

FIG. 16 is a sectional view of a part of a flexible wiring board 105 according to a sixth embodiment. As illustrated in FIG. 16, low flexibility parts 6*a* and 6*b* include parts of a first region 4. In other words, as viewed from the Z-axis direction, the low flexibility parts 6*a* and 6*b* are mostly not overlapped with the flexible wiring 2, and are provided in second regions 5*a* and 5*b*, but parts of the low flexibility parts 6*a* and 6*b* are overlapped with the flexible wiring 2.

Such a structure as illustrated in FIG. 16 can be obtained by providing upper layer second members 3*c* on a lower layer first member 3*b* and providing, on these members, the flexible wiring such that the ends thereof are overlapped with the upper layer second members 3*c*. As in Modification Example 3 of the second embodiment, when the lower layer first member 3*b* is uniform in thickness, the parts with the second members serve as low flexibility parts. Such a structure allows the flexible wiring 2 to be kept from smearing and spreading in the Y-axis direction. In other words, the wiring width of the flexible wiring 2 can be controlled.

Seventh Embodiment

Figure 17:
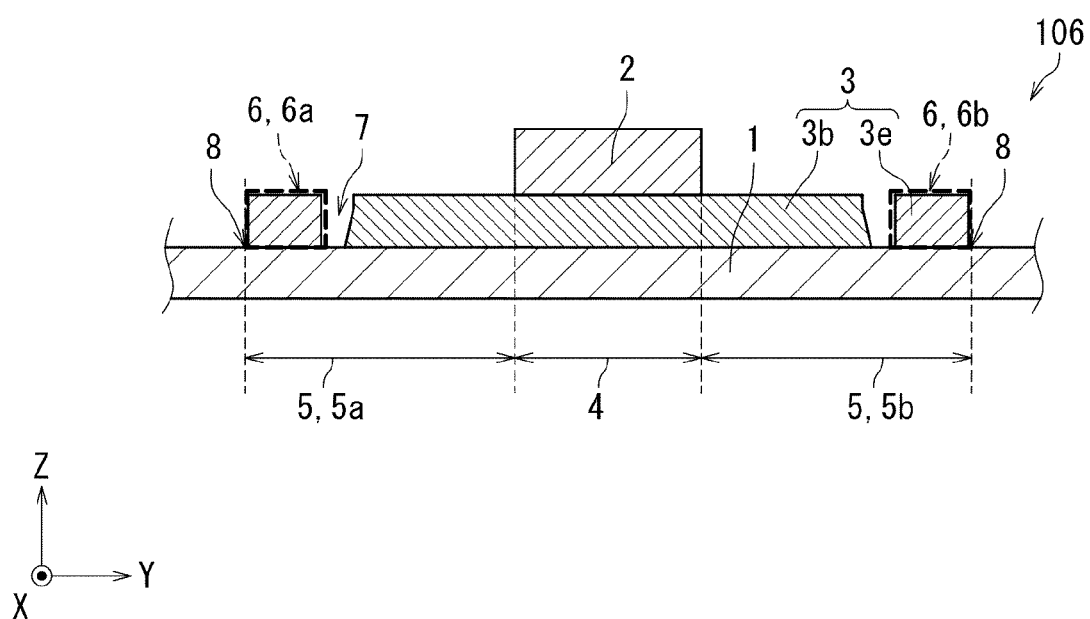
FIG. 17 is a sectional view of a part of a flexible wiring board according to a seventh embodiment.

FIG. 17 is a sectional view of a part of a flexible wiring board 106 according to a seventh embodiment. As shown in FIG. 17, when a protective layer 3 includes multiple members, a protective layer non-formed region 7 may be provided between the first member and the second member. More specifically, low flexibility parts 6*a* and 6*b* of the protective layer may be formed by parts 3*e* physically independent from other parts of the protective layer.

For example, when multiple members that differ in flexibility ratio are combined in the Y-axis direction as in Modification Embodiment 2 of the second example, there is a possibility that the protective layer will be separated due to the difference in flexibility. As shown in FIG. 17, the multiple members separated from the beginning are combined with the protective layer non-formed region 7 provided, thereby allowing unintended separation of the protective layer to be suppressed.

DESCRIPTION OF REFERENCE SYMBOLS

1: Flexible substrate
2, 2a, 2b, 2c, 2d: Flexible wiring
3: Protective layer
3a: Upper layer first member
3b: Lower layer first member
3c: Upper layer second member
3d: Lower layer second member
4, 4a, 4b, 4c, 4d: First region
5, 5a, 5b, 5c, 5d, 5e: Second region
6, 6a, 6b, 6c: Low flexibility part
7: Protective layer non-formed region
8: Protective layer end
9a, 9b: Component connection
10, 10a, 10b, 10c: Electronic component
21: First flexible wiring
22: Second flexible wiring
100, 100a, 100b, 101, 101a, 101b, 101c, 102.103, 104, 105, 106: Flexible wiring board

The invention claimed is:

1. A flexible wiring board comprising:
a flexible substrate;
a flexible wiring over the flexible substrate; and
a protective layer over the flexible substrate, wherein the protective layer includes:
  a first region that overlaps the flexible wiring and a second region that does not overlap with the flexible wiring as viewed from a thickness direction of the flexible substrate, and
  a low flexibility part that is higher in flexibility ratio than the first region and is disposed along an extending direction of the flexible wiring in the second region, wherein
  the second region extends on each of opposed sides of the flexible wiring in a width direction of the flexible wiring transverse to the extending direction of the flexible wiring, and
  the low flexibility part is in each of the second regions.

2. The flexible wiring board according to claim 1, wherein the first region is between the flexible wiring and the flexible substrate in the thickness direction of the flexible substrate.

3. The flexible wiring board according to claim 1, wherein the flexible wiring is in direct contact with the flexible substrate and the protective layer covers the flexible wiring.

4. The flexible wiring board according to claim 1, wherein the first region and the second region cover a whole periphery of the flexible wiring.

5. The flexible wiring board according to claim 1, wherein the low flexibility part is larger in thickness than a largest thickness part of the first region.

6. The flexible wiring board according to claim 1, wherein the low flexibility part has a largest thickness among a combined thickness of the protective layer and the flexible wiring.

7. The flexible wiring board according to claim 1, wherein the protective layer includes multiple members that have different Young's modulus.

8. The flexible wiring board according to claim 1, wherein the protective layer has a higher Young's modulus than the flexible substrate.

9. The flexible wiring board according to claim 1, wherein the low flexibility part of the protective layer has a higher Young's modulus than the first region.

10. The flexible wiring board according to claim 1, wherein the low flexibility part is in contact with the first region in a width direction of the flexible wiring.

11. The flexible wiring board according to claim 1, wherein the second region has a thickness that gradually increases from a first part thereof closest to the flexible wiring to a second part thereof farthest from the flexible wiring in a width direction of the flexible wiring.

12. The flexible wiring board according to claim 1, wherein the protective layer includes a central part an equal distance from opposed ends of the protective layer in a width direction of the flexible wiring, and a thickness of the protective layer gradually increases from the central part towards each of the opposed ends.

13. The flexible wiring board according to claim 1, wherein the protective layer overlaps with a whole of the flexible substrate as viewed in the thickness direction of the flexible substrate.

14. The flexible wiring board according to claim 1, wherein the low flexibility part of the protective layer is physically independent from the first region of the protective layer.

15. The flexible wiring board according to claim 1, wherein the low flexibility part overlaps with the flexible wiring.

16. A flexible wiring board comprising:
a flexible substrate;
a flexible wiring over the flexible substrate; and
a protective layer over the flexible substrate, wherein the protective layer includes:
  a first region that overlaps the flexible wiring and a second region that does not overlap with the flexible wiring as viewed from a thickness direction of the flexible substrate, and
  a low flexibility part that is higher in flexibility ratio than the first region and is disposed along an extending direction of the flexible wiring in the second region,
wherein the protective layer is between the flexible wiring and the flexible substrate in the thickness direction of the flexible substrate, and the protective layer also covers the flexible wiring.

17. A flexible wiring board comprising:
a flexible substrate;
a flexible wiring over the flexible substrate; and
a protective layer over the flexible substrate, wherein the protective layer includes:
  a first region that overlaps the flexible wiring and a second region that does not overlap with the flexible wiring as viewed from a thickness direction of the flexible substrate, and
  a low flexibility part that is higher in flexibility ratio than the first region and is disposed along an extending direction of the flexible wiring in the second region, wherein the flexible wiring includes first and second flexible wirings adjacent to each other, and the low flexibility part is between the first flexible wiring and the second flexible wiring.

18. The flexible wiring board according to claim 17, wherein an interval between the first flexible wiring and the second flexible wiring is larger than an interval between the first flexible wiring and an end of the protective layer closer to the first flexible wiring in a width direction of the flexible wiring.

\* \* \* \* \*